United States Patent [19]

Yamagishi

[11] 4,003,266

[45] Jan. 18, 1977

[54] ACTUATOR FOR PUSHBUTTON TUNER

[75] Inventor: Shohei Yamagishi, Tokyo, Japan

[73] Assignee: Nihon Technical Kabushiki Kaisha, Japan

[22] Filed: June 11, 1975

[21] Appl. No.: 586,082

[30] Foreign Application Priority Data

Nov. 12, 1974 Japan .............................. 49-129570

[52] U.S. Cl. .............................. 74/10.33; 74/10.27; 74/10.31; 334/7

[51] Int. Cl.² ......................................... F16H 35/18

[58] Field of Search ............ 74/10.33, 10.27, 10.29, 74/10.31, 10.35, 10.37; 334/7

[56] References Cited

UNITED STATES PATENTS

| 3,412,619 | 11/1968 | Pelletier | 334/7 |
|---|---|---|---|
| 3,463,017 | 8/1969 | Stann et al. | 334/7 |
| 3,727,156 | 4/1973 | Olah | 334/7 |
| R27,179 | 9/1971 | Newman | 74/10.27 |

Primary Examiner—Samuel Scott
Assistant Examiner—Randall Heald
Attorney, Agent, or Firm—Robert E. Burns; Emmanuel J. Lobato; Bruce L. Adams

[57] ABSTRACT

An interconnecting member which operatively connects a pushbutton slide with either one of a pair of tuning slides selectively is carried by shift means which moves it from one of its operational positions to the other. When a selected tuning slide reciprocates within a stationary guide channel together with the pushbutton slide, the interconnecting member moves over the shift means concurrently.

11 Claims, 7 Drawing Figures

ACTUATOR FOR PUSHBUTTON TUNER

BACKGROUND OF THE INVENTION

The invention relates to a double band pushbutton tuner, and more particularly to an actuator which connects a pushbutton member with a tuning slide which belongs to a selected frequency band.

A pushbutton tuner is known in which each pushbutton slide is adapted to selectively drive either one of a pair of associated tuning slides. Such tuner is often used in a two frequency band radio set. In a conventional tuner, each pushbutton slide carries an interconnecting member having a rocker arm or pin and which slides or tilts laterally in response to an operation of a band change-over switch for engagement with either one of adjacent tuning slides. At this end, each tuning slide is formed with a slot which is engaged by the interconnecting member. An actuator having a laterally moving interconnecting member is described in U.S. Pat. No. 3,722,299 issued to Knight et al. on Mar. 27, 1973. In this patent, the interconnecting member comprises a T-shaped pin, with the horizontal arm disposed within a pin guide carried by the pushbutton slide while the upstanding pin portion extends into a slot formed in a laterally shiftable plate. Thus, when the shift plate is displaced laterally, the T-shaped pin moves also laterally within the pin guide. During such movement, the upstanding end of the pin produces a force as a result of its abutting engagement with the shift plate, which force urges the pin not only in the lateral direction but also downwardly, thereby giving rise to a substantial amount of sliding friction between the pin and guide. As a consequence, a high load is applied to the shift plate which drives the pin, thereby adversely influencing on a smooth operation of the shift plate. An actuator having a tiltable interconnecting member is described, for example, in U.S. Pat. No. 3,357,264 issued to G. H. Newman on Dec. 12, 1967 and also in U.S. Pat. No. 3,415,129 issued to R. D. Stamm on Dec. 10, 1968. In these actuators, the interconnecting member is pivotally mounted on a pivot which is carried by the pushbutton slide, so that the problem of sliding friction as mentioned above does not result. However, a degree of friction occurs between the pivot and the interconnecting member, which somewhat impedes the movement of the shift plate which operates to tilt the interconnecting member. In addition, the provision of such a tiltable interconnecting member results in a complex structure, thereby requiring a time consuming assembly and repair.

SUMMARY OF THE INVENTION

Therefore, it is an object of the invention to provide an actuator of pushbutton tuner employing an interconnecting member which is operative as a shift plate moves, without imposing a significant load thereon when the shift plate is operated.

It is another object of the invention to provide an actuator of pushbutton tuner which is simple in structure and which can be easily assembled, adjusted and repaired.

It is a further object of the invention to provide an actuator of a pushbutton tuner including an interconnecting member which provides a firm connection between a pushbutton slide and a selected tuning slide against loosening or disengagement from each other as they reciprocate within stationary guide channels.

In accordance with the invention there is provided an actuator of a pushbutton tuner which avoids friction between an interconnecting member and a support therefor when the interconnecting member moves from one of the pair of tuning slides to the other. The actuator comprises an interconnecting member carried by a shift plate and which is adapted to move therewith as the latter moves. The interconnecting member engages the edge of an opening formed in the shift plate, and is displaced laterally as the shift plate is laterally moved, thereby operatively connecting the pushbutton slide with a selected tuning slide. As the pushbutton slide and the selected tuning slide reciprocate lengthwise, the interconnecting member also slides in the same direction along the opening. The term "lengthwise" is used herein to mean the direction of movement of the pushbutton slide and the tuning slide. The term "lateral" means a direction which is perpendicular to the lengthwise direction. The shift plate is operated by a manually operated lever arm without the interposition of a cam follower, but as it moves, no sliding occurs between it and the interconnecting member, so that the above objects of the invention can be accomplished satisfactorily.

BRIEF DESCRIPTION OF THE DRAWINGS

The above and other objects, features and advantages of the invention will become apparent from the following detailed description of preferred embodiments shown in the attached drawings, in which.

DESCRIPTION OF THE PREFERRED EMBODIMENTS

Figure 1:
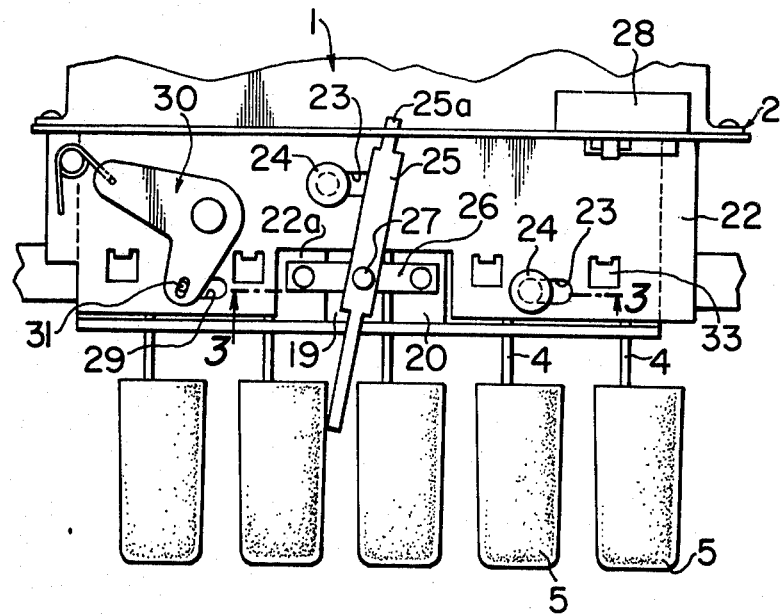
FIG. 1 is a fragmentary plan view of a pushbutton tuner constructed in accordance with the invention.
Figure 2:
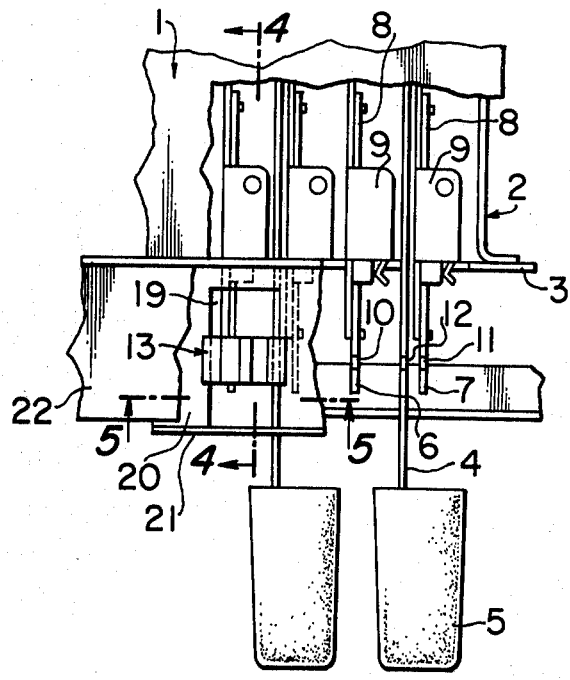
FIG. 2 is a plan view, partly cut away, of a portion of the pushbutton tuner shown in FIG. 1.

For clarity and brevity of description, a tuning mechanism 1 in which the actuator according to the invention is incorporated is not shown in detail. It may be of any conventional design, as illustrated by the above cited U.S. Patents.

A pushbutton assembly includes a plurality of pushbutton slides 4 which extend through a front wall 3 of a framework 2, generally in a parallel arrangement. Each pushbutton slide 4 is provided with a pushbutton 5 at its forward end, and is mounted in a stationary guide channel within the framework 2 so as to slide therein from a forward inoperative position to a rearward operative position as the pushbutton 5 is operated. As in a conventional double band pushbutton tuner, a pair of tuning slides 6, 7 are disposed on opposite sides of each pushbutton slide 4, and are each provided with a cam 8 of a known form and associated positioning means 9. The tuning slides are also mounted in stationary guide channels within the framework 2 so as to slide therein between their forward inoperative position and their rearward operative position. Adjacent to their forward end, the respective tuning slides 6, 7 are formed with slots 10, 11, respectively. It should be noted that in accordance with the invention, a slot 12 is formed in the pushbutton slide 4 which is generally aligned in the lateral direction with the slots 10 and 11.

Figure 7:
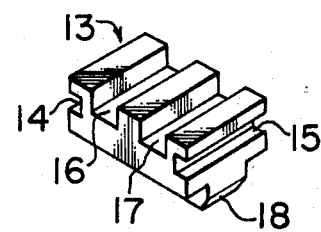
FIG. 7 is a perspective view of the interconnecting member.

An interconnecting member which operatively connects the pushbutton slide 4 with either one of the pair of tuning slides 6, 7 is generally indicated by reference numeral 13. As will be noted from FIG. 7, the interconnecting member 13 is generally rectangular in configuration, and is formed with a pair of lengthwise extending grooves 14, 15 in its opposite sidewalls, a pair of lengthwise extending grooves 16, 17 in its top surface, and a laterally extending flange 18 which projects downwardly from the bottom thereof. The flange 18 has a length measured along the lateral direction which is greater than the distance between the pushbutton slide 4 and each tuning slide 6, 7 and which preferably is less than the spacing between the pair of tuning slides 6, 7 so that it is maintained in engagement with the slot 12 in the pushbutton slide 4 and with either one of the slots 10, 11 of the pair of tuning slides 6, 7.

Figure 3:
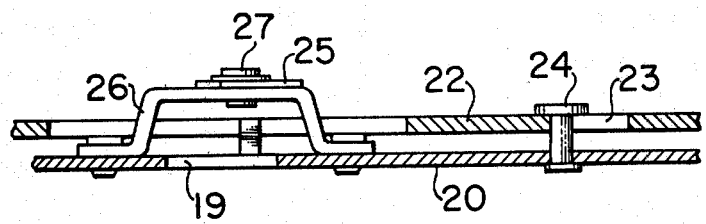
FIG. 3 is a cross section view of shift means taken along the section line 3—3 shown in FIG. 1.
Figure 4:
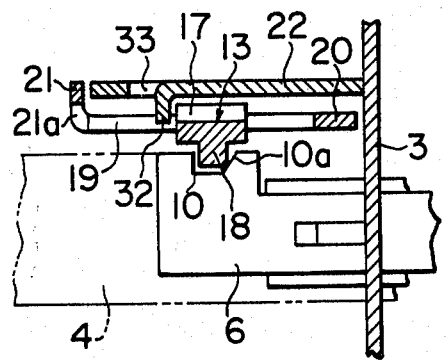
FIG. 4 is a cross section view taken along the section line 4—4 shown in FIG. 2.
Figure 5:
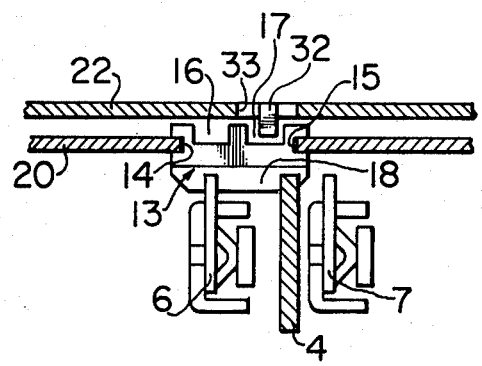
FIG. 5 is a cross section view taken along the section line 5—5 shown in FIG. 2.
Figure 6:
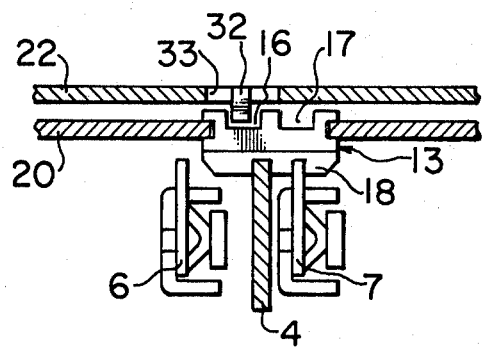
FIG. 6 is a similar cross section view to FIG. 5, but illustrating a a different operational position.

Shift means includes a shift plate 20 which is formed with a plurality of apertures or notches 19 each associated with the respective pushbutton slides 4. The interconnecting member 13 is mounted on the shift plate 20 in a manner such that the grooves 14, 15 in its sidewalls receive the edges of the aperture 19. The aperture 19 is elongate lengthwise so as to permit a sliding movement of the interconnecting member 13 therein. In order to engage the interconnecting member 13 with the edges of the aperture 19, the shift plate 20 has its forward margin 21 bent upwardly at its bend 21a where it communicates with the aperture 19, and the aperture 19 has an increased width laterally in that portion of the shift plate 20 which is located forwardly of the bend 21a, as will be noted from FIG. 4. The shift plate 20 having the interconnecting members 13 mounted thereon is laterally slidably mounted on a support plate 22 which extends forwardly from the framework 2. This will be readily appreciated by reference to FIGS. 1 and 3 wherein it will be noted that the support plate 22 is formed with a pair of laterally extending slots 23, through which a pair of flanged upright pin 24 secured to the shift plate 20 extend. When mounting the shift plate 20 on the support plate 22, the interconnecting member 13 mounted on the shift plate 20 will be oriented so that the downwardly extending flange 18 engages the slot 12 in the pushbutton slide 4. In this manner, when the shift plate 20 is moved to the left, all the interconnecting members 13 will be displaced to the left, as shown in FIG. 5, whereby the interconnecting members 13 operatively connect the pushbutton slides 4 to the respective left-hand tuning slides 6. As the pushbutton 5 is depressed or moved inwardly to move the associated pushbutton slide 4 to its rearward operative position, the left-hand tuning slide 6 which is associated with this slide 4 will be similarly moved to its rearward operative position. An inclined edge 10a may be formed at the rear end of the slot 10 in the tuning slide 6 to apply a vertical component of force on the tuning slide 6, 7 in order to prevent a tuning error which may be caused by a manufacturing tolerance. When the pushbutton slide 4 and the selected tuning slide 6 are displaced from their forward inoperative position to their rearward operative position, the interconnecting member 13 slides lengthwise along the aperture 19 in the shift plate 20. When the shift plate 20 is moved to the right, the interconnecting member 13 is displaced in a corresponding manner, which it will be appreciated is opposite to that described above.

The shift means also includes a lever arm 25 which is known in itself. The lever arm 25 is pivotally mounted at its one end 25a on the framework 2, while the other end extends forwardly to a position which is above the pushbutton 5. Intermediate its ends, the lever arm 25 is provided with a pivot 27 which is connected with a channel-shaped bracket 26 secured to the shift plate 20 and extending through a notch 22a in the support plate 22. The shift plate 20 is moved from one of its operational positions to the other by means of the lever arm 25. Such movement of the shift plate is effective to control the mechanical connection provided by the interconnecting member 13 between the pushbutton slide 4 and either one of the tuning slides 6, 7, and is also effective to control a switch 28 which determines a frequency band to be tuned by the selected tuning slide. In order to maintain the shift plate 20 in its selected operational position, the top surface of the shift plate 20 is provided with a projection 31 which extends through a slot 29 in the support plate 22 and engages a conventional snap action means 30 provided thereon.

The tuning cam 8 on the respective tuning slides 6, 7 is positioned in the similar manner as in a conventional tuner. Specifically, the positioning means 9 normally retains the cam 8 in a predetermined position, but is reset when the tuning slide 6 or 7 which carries it is pulled in a forward direction together with the pushbutton slide 4. Subsequently, the pushbutton 5 may be depressed to a preset position, followed by a further depression thereof to achieve a setting condition. As mentioned previously, the snap action means 30 maintains the shift plate in a selected operational position, and consequently the interconnecting member 13 mounted thereon is also maintained in a selected operational position to maintain a firm operative connection between the pushbutton slide 4 and either one of the tuning slides 6, 7 even during the positioning operation of the cam 8. In accordance with another aspect of the invention, a stop 32 may be provided to prevent a forward withdrawal of the pushbutton slide 4 in the vent the interconnecting member 13 assumes an intermediate position. As best shown in FIG. 4, the stop 32 comprises a tab which is formed by punching an aperture 33 in the support plate 22 and bending the edge of the punched portion downwardly. The stop 32 is located to operate on the interconnecting member 13 at a position forwardly thereof when the pushbutton slide 4 is in its forward inoperative position. When the interconnecting member 13 is forwardly withdrawn together with the pushbutton slide 4 during a normal operation, the stop 32 is received in either one of the grooves 16, 17 formed in the top of the interconnecting member 13 and therefore remains inoperative. However, when the interconnecting member assumes an improper position, the stop 32 abuts against the interconnecting member 13, thereby preventing a forward withdrawal of the pushbutton slide 4. The stop 32 can be utilized as a guide when assembling the interconnecting member 13 with the associated pushbutton slide 4, as will be further described later.

In the actuator of pushbutton tuner according to the invention, the interconnecting member 13 can be assembled with the shift plate 20 in a very simple manner without requiring any tool since it is only necessary that the interconnecting member 13 be inserted into the aperture 19 so that the grooves 14, 15 in its opposite sides engage the edges of the aperture. It is to be noted that an adjustment or a repair or a replacement can be made without dismounting any of the pushbutton slide 4 and its associated tuning slides 6, 7 from the framework 2. The shift plate 20 having the interconnecting member 13 mounted therein is initially mounted on the support plate 22, which is in turn mounted on the framework 2 in which the pushbutton slides 4 and tuning slides 6, 7 are already mounted, with attention so that the flange 18 of the interconnecting member 13 engages the slot 12 in the pushbutton slide 4. In the course of such mounting, the stop 32 on the support plate 22 serves as a suitable guide. The interconnecting member 13 can be inexpensively molded from a synthetic resin. The generally rectangular configuration of the member 13 assures a high mechanical strength. When assembled, the interconnecting member 13 has its side grooves 14, 15 firmly engaged with the shift plate 20, and the laterally extending flange 18 which projects downwardly from the bottom of the interconnecting member is reinforced by the body portion against a force applied thereto, thereby achieving a firm connection between the pushbutton slide 4 and the selected tuning slide 6, 7 against loosening or displacement so as to permit their movement as a unit.

While the invention has been described in its preferred embodiment, it should be noted that changes and modifications will readily occur to those skilled in the art. Therefore, it is intended that all such changes and modifications as occur within terms of the appended claims are covered within the scope of the present invention.

Having described the invention, what is claimed is:

1. An actuator for a pushbutton tuner comprising, a pushbutton slide movable between an inoperative position and an operative position; a pair of parallel tuning slides parallel with said pushbutton slide on opposite sides thereof, an interconnecting member disposed extending transversely of said pushbutton slide for selectively, operatively connecting alternatively and alternately the pushbutton slide with either one of the pair of tuning slides for maintaining an operative connection therebetween so that the selected tuning slide can be moved between its inoperative position and its operative position as the pushbutton slide is moved axially; shift means for moving the interconnecting member transversely of the pushbutton slide between a pair of operational positions in order to disconnect the operative connection between the pushbutton slide and a selected tuning slide and to operatively connect the pushbutton slide with the other tuning slide; the shift means including a shift plate movable along a line joining the pair of operational positions of the interconnecting member for actuating the interconnecting member to the operational positions thereof alternately; and guide means on said shift plate for permitting the interconnecting member to be moved together with the pushbutton slide.

2. An actuator according to claim 1 in which said guide means comprises an aperture in the shift plate and the interconnecting member having side grooves slidably engaging edges of the aperture.

3. An actuator according to claim 1, in which the pushbutton slide and the tuning slides are disposed in juxtaposition so that they have oppositely located side surfaces, the interconnecting member being movable in a direction perpendicular to the opposite surfaces for operatively connecting the pushbutton slide with one of the tuning slides selectively.

4. An actuator according to claim 3, in which the pair of tuning slides each include a slot, and wherein the pushbutton slide includes a slot, the interconnecting member being movable in the slot of the pushbutton slide and alternately into one of the slots of the pair of tuning slides.

5. An actuator according to claim 4, in which the slot in the pushbutton slide is aligned with the slots of the pair of tuning slides.

6. An actuator according to claim 1 in which the interconnecting member moves with said tuning slide in operation and exerts a force upon the selected tuning slide having a first component which is effective in the direction in which the tuning slide is operated and a second component which lies in a direction perpendicular to the first mentioned direction.

7. An actuator according to claim 1, further including snap action means for resiliently urging the shift plate in a direction so that the interconnecting member is maintained in one of the operational positions.

8. An actuator according to claim 1, further including tuning cams and other tuning slides and associated positioning means carried by the respective tuning slides, the positioning means being reset when the associated tuning slide has moved forwardly of the inoperative position, means for guiding the selected tuning slide to the reset position together with the pushbutton slide and the interconnecting member, and means for inhibiting the guide means when the interconnecting member is displaced from either of the pair of operational positions.

9. An actuator according to claim 8 in which said inhibiting means comprises means to prevent a forward movement of the interconnecting member.

10. An actuator according to claim 8 in which the inhibiting means comprises a projection extending from the interconnecting member and a stationary tab for cooperating with the projection to prevent a forward movement thereof.

11. An actuator according to claim 1, in which the interconnecting member is molded from a synthetic resin.

* * * * *